United States Patent
Kashem et al.

(10) Patent No.: US 12,265,467 B1
(45) Date of Patent: Apr. 1, 2025

(54) METHODS FOR ENHANCED MEMORY CONTEXT RESTORE

(71) Applicant: Advanced Micro Devices, Inc., Santa Clara, CA (US)

(72) Inventors: Anwar Parvez Kashem, Sudbury, MA (US); Alicia Wen Ju Yurie Leong, Austin, TX (US); Glennis Eliagh Covington, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 18/478,016

(22) Filed: Sep. 29, 2023

(51) Int. Cl.
G06F 12/00 (2006.01)
G06F 12/02 (2006.01)
G06F 13/16 (2006.01)
G11C 11/4076 (2006.01)

(52) U.S. Cl.
CPC ........ G06F 12/023 (2013.01); G06F 13/1668 (2013.01); *G06F 2212/251* (2013.01); *G11C 11/4076* (2013.01)

(58) Field of Classification Search
CPC ............... G06F 12/023; G06F 13/1668; G06F 2212/251; G11C 11/4076
See application file for complete search history.

(56) References Cited

U.S. PATENT DOCUMENTS

| | | | |
|---|---|---|---|
| 2013/0230091 A1* | 9/2013 | Chini | H04L 7/041 375/295 |
| 2015/0378603 A1* | 12/2015 | Dearth | G06F 13/4072 711/154 |
| 2019/0317683 A1* | 10/2019 | Mayer | G11C 29/023 |
| 2022/0246184 A1* | 8/2022 | Bhatia | H03K 19/21 |

* cited by examiner

*Primary Examiner* — Craig S Goldschmidt
(74) *Attorney, Agent, or Firm* — FIG. 1 Patents

(57) ABSTRACT

Enhanced methods for memory context restore are described. A device may include a physical layer (PHY) having an interface to support communication of command signals and data with a physical memory. The PHY implements a training mode to train the interface, detect values of a plurality of parameters as part of training the interface, and store the detected values as initial training data. The PHY also implements a retraining mode to use the initial training data as seed data to retrain the interface.

20 Claims, 4 Drawing Sheets

METHODS FOR ENHANCED MEMORY CONTEXT RESTORE

BACKGROUND

The amount of data and a speed at which data is accessible from physical memory by a computing device is a driving factor on overall device operation. Because of this operational effect, techniques are continually developed to increase this speed, accuracy, and storage capability of physical memory, an example of which includes dynamic random access memory (DRAM). This continued development, however, has encountered additional challenges that affect when data is accessible from the physical memory, challenges resulting from environmental conditions (e.g., heat) on the operation of the physical memory, and so forth.

BRIEF DESCRIPTION OF THE DRAWINGS

The detailed description is described with reference to the accompanying figures.

DETAILED DESCRIPTION

Figure 1:
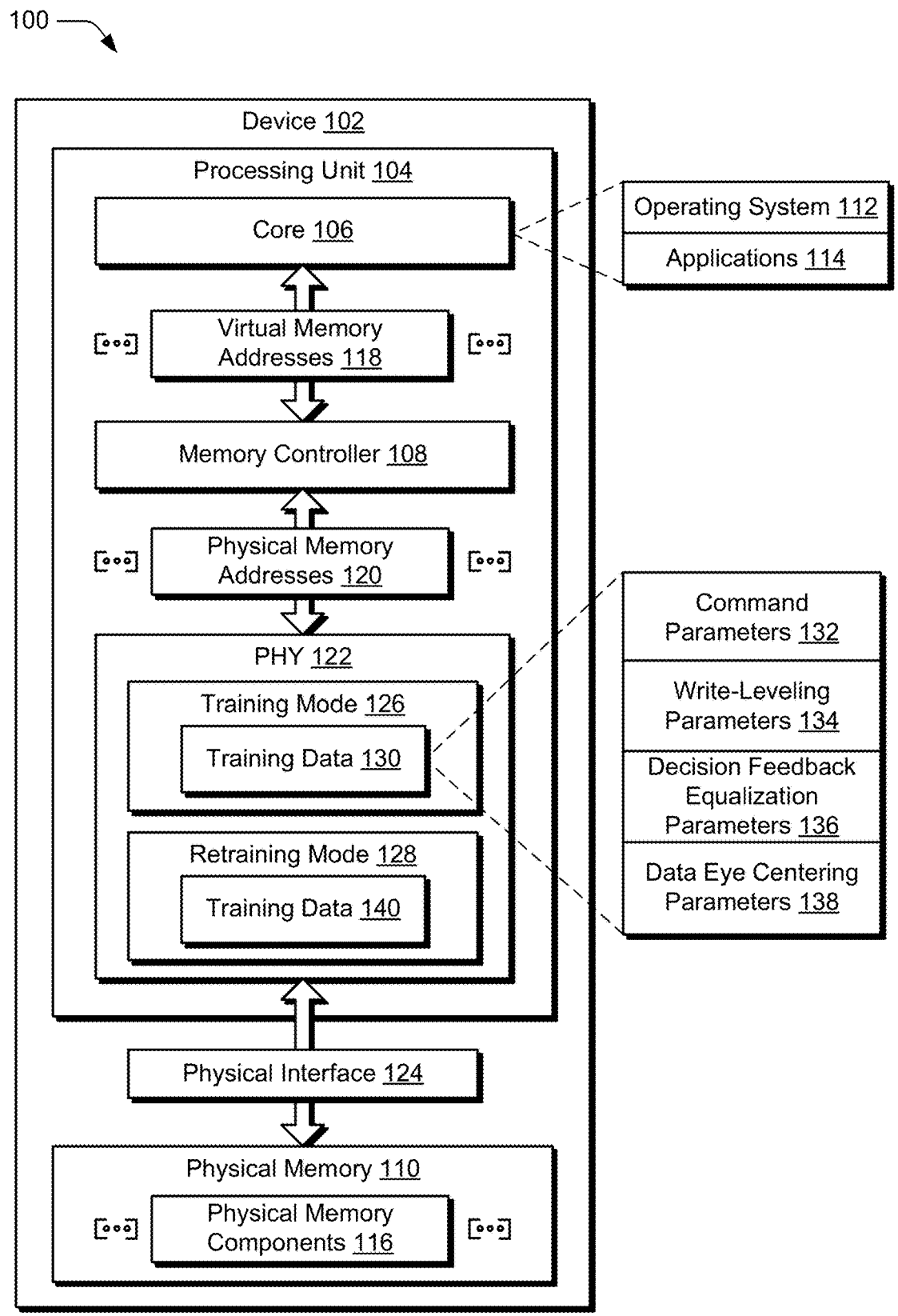
FIG. 1 is a block diagram of a non-limiting example system configured to employ training and retraining mode techniques described herein.

A PHY, also referred to as a physical layer, is typically implemented as an integrated circuit to provide a physical interface in hardware between a processing unit (e.g., a central processing unit) and physical memory, e.g., dynamic random access memory. The PHY is responsible for converting digital data from the processing unit into analog electrical signals that are transmitted over the physical interface to the physical memory. Likewise, the PHY is also responsible for converting analog electric signals received over the physical interface into digital data for use by the processing unit.

As part of implementing the physical interface, training is performed by the PHY (e.g., at startup) to set parameters of the physical interface in order to optimize communication. Training facilitates adjusting the PHY to account for various factors such as design variations of the processing unit and the physical memory, manufacturing variations of the processing unit and the physical memory, environmental variations (e.g., temperature, humidity, etc.), silicon variations, trace variations, and so on. A non-exhaustive list of parameters that can be set as part of training include impedance calibration, command address timing and signaling parameter calibration, and so on.

Voltage and timing reference parameters are also set as part of training by adjusting voltage levels and clock phase to establish a common voltage and timing reference for signals communicated between the PHY and the physical memory. For example, data eye centering is a memory training operation where values for a reference voltage (Vref) and a strobe delay used to detect signals in a data signal lane (e.g., DQ lane) are adjusted to increase the likelihood of correctly detecting a logic high (e.g., from bit '0' to bit '1') and a logic low transition on the DQ lane. As another example, read and write leveling is set as part of training by adjusting a relative timing of clock and data signals over the physical interface to coordinate data sampling. A data strobe signal (DQS), for instance, is aligned with data signals (DQ) during reading operations to define "when" the data signals are sampled based on the data strobe signal.

Conventional techniques used to perform a full training of all possible parameters by the PHY, however are inefficient, consume a significant amount of time to perform depending on the resource configuration of the system (e.g., 10 to 15 minutes on some systems), and result in increased power consumption. In particular, conventional training technique examples involve a brute force approach or a periodic training approach. In a conventional brute force approach, a range of possible values is tested by the PHY for each of the parameters, e.g., for impedance, voltage and timing references, equalization settings, clock phase, and so on as described above. Consequently, the PHY is tasked with comparing and evaluating each combination of the parameters in order to identify an optimal combination that yields the best results, e.g., a highest communication speed that also supports reliable communication. A conventional brute force approach, therefore, may consume significant resources in evaluating a potentially large number of combinations of parameters. Furthermore, performing a conventional brute force approach every time a system is restarted or rebooted may be impractical in some applications, such as applications where a system is frequently restarted every day.

A periodic training approach involves scheduling periodic training events (e.g., every 30 days, 60 days, etc.) at which the system forces the PHY to perform the full (brute force) training procedure during the next startup. In a perioding training approach, for instance, training data such as impedances and data throughput are measured and characterized for physical connections between a PHY and physical memory configuration once, and the system reuses the training data every time the system is restarted until a given number of days lapses from the last time the full training procedure was executed. However, such reliance on outdated training data may result in memory communication errors and/or delays due to factors such as silicon variation (e.g., resistivity of a resistor drifts over time), trace variation (e.g., impedance variation over time), and/or environmental variations (e.g., temperature or humidity changes may affect resistivity of a resistor, electrical characteristics of a power regulator, etc.).

To solve these technical problems, a PHY implements a training mode to train parameters as part of a physical interface that supports communication of data and command signals between the PHY and the physical memory, detects values of a plurality of parameters as part of training the interface, and stores the detected values as initial training data. A retraining mode is also implemented by the PHY after the parameters of the physical interface were set in the training mode (e.g., in response to a later start-up or reboot event) to retrain the interface using the initial training data as seed data.

In the training mode, a comprehensive training procedure is performed to detect values of a plurality of parameters needed to control communication between the PHY and the physical memory. For example, equalization settings (e.g., decision feedback equalization (DFE) coefficients or DFE taps) by communicating test patterns with the physical memory to calibrate the DFE coefficients by sweeping through a range of possible values (e.g., 50 values, etc.) of each DFE coefficient until optimal values are identified (e.g., values that maximize the vertical and/or horizontal extents of a data eye, etc.). Data eye centering training can then be performed to identify a voltage reference (Vref) and strobe delay near the center of each data eye (e.g., to increase the likelihood of correctly distinguishing between a logic high bit '1' and a logic low bit '0' when reading or writing data to the physical memory). As yet another example, command address timing training is performed to calibrate command signals and clock signals communicated between the PHY and individual DRAM modules in the physical memory. As yet another example, write leveling training (e.g., clock-to-DQS training) is performed to optimize clock and strobe timings used to control the physical memory (e.g., so that rising or falling edges occur within a certain time span of each other).

In the retraining mode (e.g., fast boot feature), the PHY performs a less comprehensive or limited training procedure to partially update a portion of the initial training data to account for changes to certain parameters that may be more critical or more likely to drift than other parameters while retaining the previously detect values for other less critical parameters. By way of example, the retraining mode skips retraining DFE coefficients and instead reuses previously trained DFE coefficient values to update the data eye centering parameters (e.g., Vref and strobe delay values). As another example, the retraining mode skips retraining command address timing/signaling parameters but retrains write-leveling parameters (e.g., which may have a relatively more detrimental effect on overall performance if they are uncalibrated). As yet another example, the PHY uses the data values in the initial training data as seed data to reduce the space searched when retraining a particular parameter. For instance, a previously detected Vref value can be used as a seed value to arrive at an updated optimal value instead of starting a full sweep of possible values (e.g., from a minimum value to a maximum value).

By selectively retraining the interface of the PHY to focus on a subset of the parameters rather than performing a full comprehensive training every time a system is restarted, the present disclosure provides improvements in computing resource consumption and computing delays (e.g., efficiency) during startup (e.g., a fast reboot option) by reducing the space searched (e.g., range of possible values of each parameter) during the limited training procedure of the retraining mode. Further, by frequently retraining certain parameters that are critical to memory performance or that are deemed more likely to drift, the present disclosure improves computer efficiency and reduces errors and memory access delays associated with using outdated training data for a long time until a next scheduled comprehensive memory training trigger event.

In some aspects, the techniques described herein relate to a device including: a physical memory and a physical layer (PHY) having an interface to support communication of command signals and data with the physical memory, the PHY implementing: a training mode to train the interface, detect values of a plurality of parameters as part of training the interface, and store the detected values as initial training data; and a retraining mode to use the initial training data as seed data to retrain the interface.

In some aspects, the techniques described herein relate to a device, wherein the interface implements an interface protocol that employs the plurality of parameters to control communication of the command signals and the data with the physical memory.

In some aspects, the techniques described herein relate to a device, wherein the plurality of parameters includes at least one parameter associated with voltage reference (Vref) training, command training, clock-to-strobe leveling, write-leveling training, or strobe-to-DQ training of the interface protocol.

In some aspects, the techniques described herein relate to a device, wherein the plurality of parameters includes a parameter for controlling intersymbol interference between physical memory components of the physical memory.

In some aspects, the techniques described herein relate to a device, wherein the retraining mode detects updated values of a first subset of the plurality of parameters and reuses previously stored values of a second subset of the plurality of parameters as part of retraining the interface.

In some aspects, the techniques described herein relate to a device, wherein the first subset includes parameters associated with voltage reference (Vref) and strobe delay training for data eye centering, and wherein the second subset includes parameters associated with decision feedback equalization (DFE) coefficient training.

In some aspects, the techniques described herein relate to a device, wherein the first subset includes a first parameter associated with write-leveling training, and wherein the second subset includes a second parameter associated with command address timing training.

In some aspects, the techniques described herein relate to a device, wherein the PHY includes another interface to transfer command signals and data with a memory controller.

In some aspects, the techniques described herein relate to a device, wherein the PHY is implemented in hardware as part of an integrated circuit, the interface is bidirectional, and the physical memory is a dynamic random access memory (DRAM).

In some aspects, the techniques described herein relate to a system including: a memory controller; a dynamic random access memory (DRAM); and a physical layer (PHY) communicatively coupled with the memory controller and the DRAM, the PHY implementing: a training mode to detect values of a plurality of parameters as part of training an interface between the PHY and the DRAM, and to store the detected values as initial training data; and a retraining mode to use the initial training data as seed data to retrain the interface between the PHY and the DRAM.

In some aspects, the techniques described herein relate to a system, wherein the interface implements an interface protocol that employs the plurality of parameters to control communication of the command signals and the data with the physical memory.

In some aspects, the techniques described herein relate to a system, wherein the plurality of parameters includes at least one parameter associated with voltage reference (Vref)

training, command training, clock-to-strobe leveling, write-leveling training, or strobe-to-DQ training of the interface protocol.

In some aspects, the techniques described herein relate to a system, wherein the plurality of parameters includes a parameter for controlling intersymbol interference between physical memory components of the physical memory.

In some aspects, the techniques described herein relate to a system, wherein the retraining mode detects updated values of a first subset of the plurality of parameters and reuses previously stored values of a second subset of the plurality of parameters as part of retraining the interface.

In some aspects, the techniques described herein relate to a system, wherein the first subset includes parameters associated with voltage reference (Vref) and strobe delay training for data eye centering, and wherein the second subset includes parameters associated with decision feedback equalization (DFE) coefficient training.

In some aspects, the techniques described herein relate to a system, wherein the first subset includes a first parameter for write-leveling training, and wherein the second subset includes a second parameter for command address timing training.

In some aspects, the techniques described herein relate to a method including: setting a training mode to train an interface between a physical layer (PHY) and physical memory for communicating command signals or data, detect values of a plurality of parameters as part of training the interface, and store the detected values as initial training data; and setting a retraining mode to use the initial training data as seed data to retrain the interface.

In some aspects, the techniques described herein relate to a method, wherein retraining the interface includes detecting updated values of a first subset of the plurality of parameters and reusing previously stored values of a second subset of the plurality of parameters.

In some aspects, the techniques described herein relate to a method, wherein the first subset includes parameters associated with voltage reference (Vref) and strobe delay training for data eye centering, and wherein the second subset includes parameters associated with decision feedback equalization (DFE) coefficient training.

In some aspects, the techniques described herein relate to a method, wherein the first subset includes a first parameter for write-leveling training, and wherein the second subset includes a second parameter for command address timing training FIG. 1 is a block diagram of a non-limiting example system 100 configured to employ the training and operational mode techniques described herein. These techniques are usable by a wide range of device 102 configurations. Examples of those devices include, by way of example and not limitation, computing devices, servers, mobile devices (e.g., wearables, mobile phones, tablets, laptops), processors (e.g., graphics processing units, central processing units, and accelerators), digital signal processors, interference accelerators, disk array controllers, hard disk drive host adapters, memory cards, solid-state drives, wireless communications hardware connections, Ethernet hardware connections, switches, bridges, network interface controllers, and other apparatus configurations. Additional examples include artificial intelligence training accelerators, cryptography and compression accelerators, network packet processors, and video coders and decoders. It is to be appreciated that in various implementations, the techniques described herein are usable using any one or more of those devices listed just above and/or a variety of other devices without departing from the spirit or scope of the described techniques.

The illustrated example of the device 102 includes a processing unit 104 having a core 106 that is communicatively coupled (e.g., via a bus) to a memory controller 108 that is communicatively coupled (e.g., via a bus) to physical memory 110. The processing unit 104 in configured in hardware to execute instructions as arithmetic and logical operations, configured to control input/output devices, and manage data storage and retrieval. The processing unit is configurable as a central processing unit, a graphics processing unit, and other processing units including digital signal processing, tensor processing unites, and field-programmable gate arrays. The core 106 as part of the processing unit 104 is configurable in a variety of ways to execute instructions as part of the processing unit 104 to perform operations, e.g., in hardware as one or more integrated circuits to execute an operating system 112, applications 114, and so forth. Other configurations are also contemplated, examples of which include parallel processors, graphics processing units, and so forth.

In one example, the memory controller 108 is configured (e.g., in hardware as an integrated circuit, as a microcontroller configured to execute instructions, etc.) for I/O device usage, e.g., as an input output memory management unit (IOMMU). The memory controller 108 is configurable as part of the processing unit 104 itself (e.g., as an on-die memory controller) or configurable as a separate component on a motherboard of the device 102. Although a single instance of physical memory 110 is illustrated, the physical memory 110 is representative of a variety of types of physical memory (e.g., implemented in hardware) that are implementable together as a plurality of physical memory components 116, e.g., volatile and non-volatile memory.

The memory controller 108 is configured to control access between the core 106 and the physical memory 110. The memory controller 108, for instance, is configurable in hardware using one or more integrated circuits, supports execution of instructions through configuration as a microcontroller, and so forth. In the illustrated example, the memory controller 108 supports use of virtual memory addresses 118 of a virtual address space by the core 106 along with physical memory addresses 120 of a physical address space of the physical memory 110. Virtual memory is a technique to manage use of shared physical memory 110, e.g., by a plurality of cores. Virtual memory supports a variety of different functionality. Examples of this functionality include expansion of an amount of storage made available to applications beyond that which is actually available in the physical memory, offload memory management from the application 114 and operating system 112, use of a variety of different types of memory without the applications being made aware, support memory optimization, address memory fragmentation, and so forth.

A physical layer (PHY) 122 is employed by the processing unit 104 to implement a physical interface 124 with the physical memory 110. The PHY 122, for instance, is configurable as hardware in an integrated circuit (e.g., dedicated or included as part of the processing unit 104) communicatively disposed between the processing unit 104 and the physical memory 110. The PHY 122 is configured to support interoperability between the processing unit 104 and physical memory 110, even when developed by different manufacturers. To do so, the PHY 122 defines signals, timing, and other parameters that are programmable as part of training to define how command signals and data are transmitted over the physical interface 124.

Training is performed by the PHY 122 (e.g., at startup, adjustably during operation, etc.) to set parameters of the physical interface 124 in order to optimize communication. Examples of parameters set as part of training include impedance calibration which is set by adjusting termination resistance values in the PHY 122 and the physical memory 110. Voltage and timing reference parameters are also set as part of training by adjusting voltage levels and clock phase to establish a common voltage and timing reference for signals communicated between the PHY 122 and the physical memory 110. Read and write leveling is set as part of training by adjusting a relative timing of clock and data signals over the physical interface 124 to coordinate data sampling. A data strobe signal (DQS), for instance, is aligned with data signals (DQ) during reading operations to define "when" the data signals are sampled based on the data strobe signal.

In order to maximize speed of communication of command signals and data over the physical interface 124, the PHY 122 supports a training mode 126 and a retraining mode 128. The training mode 126 operates as a type of handshaking technique to determine values of programmable parameters that are to be used to implement the protocol, and to store the determined values as initial training data 130. A non-exhaustive list of example parameter values stored in initial training data 130 includes: command parameters 132 (e.g., parameters used to control command signaling, command address timing, etc.), write-leveling parameters 134 (e.g., clock-to-DQS training, etc.) for aligning clock and strobe rising edges, DFE parameters 136 such as DFE coefficients or other equalization settings for mitigating intersymbol interference (e.g., to increase vertical and horizontal extents of a data eye), and/or data eye centering parameters 138 by adjusting Vref and strobe delay values (e.g., near the center of a data eye) used to sample data signals (DQ) so as to increase accuracy of high/low bit detection at DQ lanes.

Conventional techniques to perform training are performed in one of two ways as described above. In a first brute force example, a significant amount of trial and error is encountered as different values are set and tested for all the parameters. This example encounters operational inefficiencies, delays, increased power consumption, and so on due to a large number of parameters being testing as well as a large number of values usable for those parameters. In a second example, a periodic scheduling approach is undertaken that relies on continuously reusing training data 130 until a scheduled date or time when a full training procedure is to be triggered (e.g., every 30 days, 60 days, etc.) to update the training data 130. With this approach, although time and computer resource consuming training procedures are performed less frequently than the brute force approach, memory failure events and/or reduced memory access efficiency due to silicon, trace, and/or environmental variation for example, is more likely to result from using outdated parameter values.

To overcome these challenges, the PHY 122 implements a retraining mode 128 configured to run relatively frequently (e.g., at every startup or reboot of the system) to perform a less comprehensive or limited memory training procedure than the full training procedure of the training mode 126. For example, the retraining mode 128 generates updated training data 140 which includes updated values detected for a first subset of parameters (e.g., write-leveling parameters 134, data eye centering parameters 138) and previously stored values of a second subset of parameter values (e.g., command parameters 132, DFE parameters 136) from the initial training data 130. As another example, the retraining mode 128 uses the initial training data 130 as seed data to reduce the search space needed to update one or more parameters in the updated training data 140.

For example, the data eye centering parameters 138 can be updated by searching a two-dimensional (2D) space of possible values (e.g., voltage and delay values) corresponding to a certain (previously resolved) set of DFE coefficients instead of a more exhaustive five dimensional (5D) or more space of possible values that also include a range of possible values of three DFE coefficients (and the range of possible Vref & delay timing values at each possible combination of DFE coefficients). In implementations where more than three DFE coefficients are reused from the initial training data 130, further time and computational resource savings can be achieved by performing the data eye centering training for each different possible combination of DFE coefficients. As another example, parameters that are updated by searching for an optimal value from an initial value can be resolved faster by using the initial training data 130 as seed data because the initial value used (which was the previous optimal value computed in in the training mode 126) is likely closer than a random starting value that would otherwise be used if no seed data was available.

Thus, the retraining mode 128 enables the PHY 122 to more efficiently and quickly retrain the physical interface 124 and generate the updated training data 140 by updating one or more parameters more efficiently (e.g., using the initial training data 130 as seed data) and/or by updating a limited subset of the parameters while skipping the retraining of (i.e., reusing) previously trained values (e.g., from the initial training data 130) of other parameters. Advantageously, the retraining mode 128 thus allows the PHY 122 to perform frequent retraining of at least some of the parameters used to control the physical interface 124 without requiring the large amount of computing power and/or time associated with executing the full training procedure of the training mode 126. As such, memory event failures and/or memory access inefficiencies associated with using outdated parameter values can be avoided or mitigated by executing the retraining mode 128 frequently while also reducing the computing overhead associated with frequently performing the more comprehensive training procedure of training mode 126.

Figure 2:
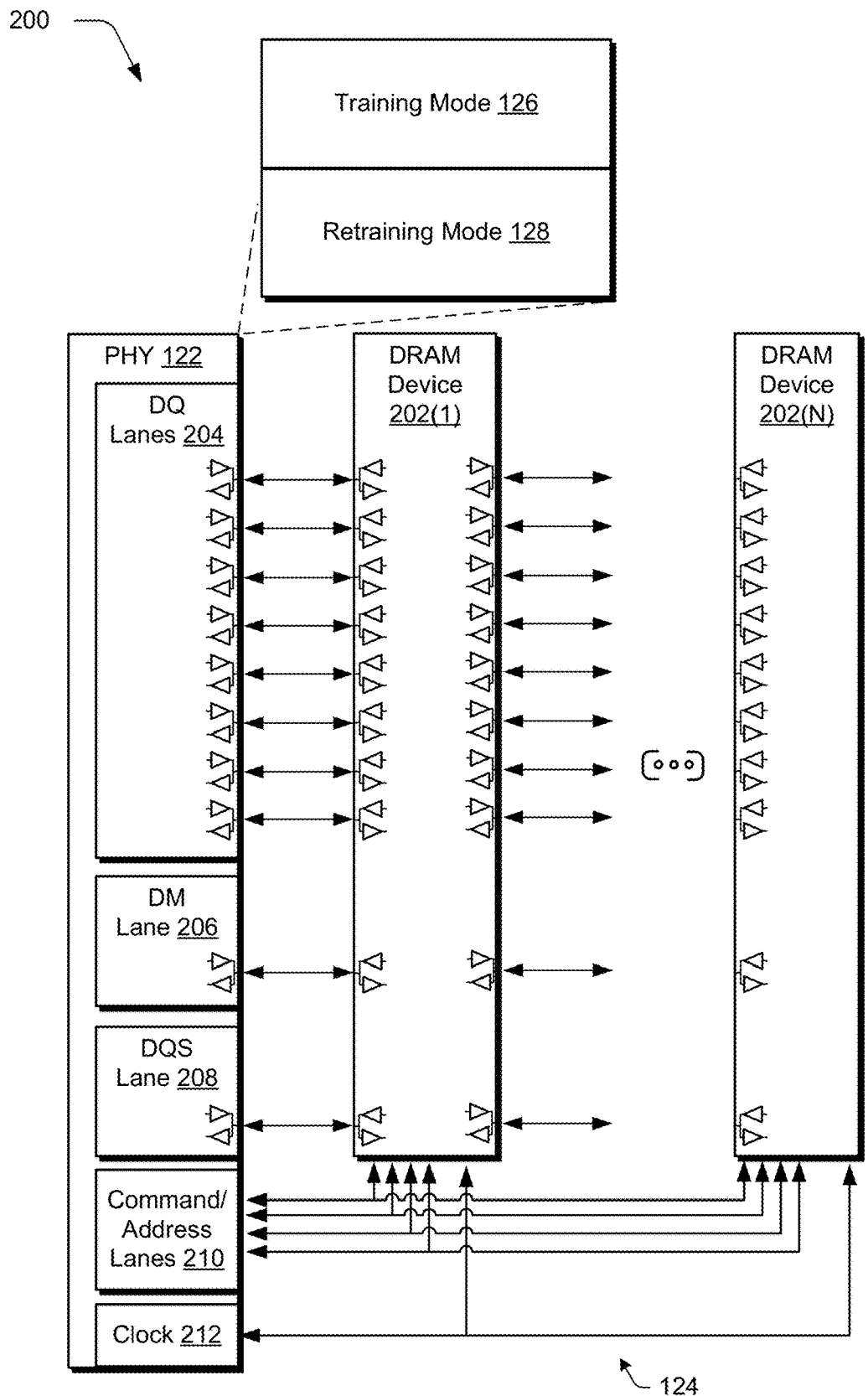
FIG. 2 is a block diagram of a non-limiting example system showing configuration of the physical layer (PHY) in greater detail as communicatively coupled via an interface to physical memory implemented using a plurality of dynamic random access memory (DRAM) devices.

FIG. 2 is a block diagram of a non-limiting example system 200 showing configuration of the PHY 122 in greater detail as communicatively coupled via the physical interface 124 to physical memory 110 implemented using a plurality of dynamic random access memory (DRAM) devices 202(1), . . . , 202(N). The PHY 122 as illustrated includes a plurality of bidirectional transceivers that implement DQ lanes 204, a DM lane 206, a DQS lane 208, command/address lanes 210, and a clock 212. The DQ lanes 204 implement data signal transfer, e.g., via respective wires illustrated using bidirectional arrows. The DM lane 206 carries a data mask signal. The data mask signal is used to selectively enable or disable the writing of data into the memory from the DQ lanes 204. When the data mask signal is asserted (active), corresponding data bits are masked or ignored during a write operation thereby allowing the memory controller to selectively write data to specific memory locations without affecting adjacent locations. The DQS lane 208 implements a data strobe that transfers a clock signal for the DQ lanes 204 and the DM lane 206. The data strobe is used to control sampling of the DQ lanes 204 and DM lane 206, e.g., based on rising and falling edges of the signal. The data strobe, for instance, of the DQS lane 208 is used to control when a data signal is sampled from the DQ lane 206 in order to define a logic one or zero.

The command/address lanes 210 support communication of command signals to the DRAM device 202(1), e.g., to respective transceivers. A variety of types of command signals and associated addresses are sent from the PHY 122 using the command/address lanes 210, examples of which include maintenance, setup, and data bearing command signals such as "reads" and "writes." For "reads" and "writes" the command signals are sent via the command/address lanes and data is transferred from the PHY 122 to the DRAM device 202(1) over the DQ lanes 204 in a write, which are sampled based on data strobe signals from the DQS lane 208. On the other hand, data is transferred from the DRAM device 202(1) to the PHY 122 over the DQ lanes 204 in a read command, which is also sampled based on data strobe signals from the DQS lane 208.

In some instances, a plurality of DRAM devices is communicatively coupled over the physical interface 124 of the PHY 122. This is implemented, in one example over a multidrop bus that is bidirectional to support communication with DRAM device 202(1), . . . , DRAM device 202(N). Use of a bidirectional multidrop bus, however, introduces challenges such as signal discontinuities and reflections caused by loads on opposing sides of the DRAM device 202(1). For example, a write from the PHY 122 to the DRAM device 202(N) involves awareness of a DRAM device 202(1) on the multidrop bus disposed in between the PHY 122 and the DRAM device 202(N), e.g., to terminate the bus to prevent unwanted signal reflections.

Training of the physical interface 124, however, involves a "chicken and the egg" problem. Training of one type of parameter, for instance, may be dependent on another type of parameter. Consequently, in practice training is confronted with ill-formed feedback (i.e., that is not formed as data packets involving a strobe and data bits) but rather asynchronous feedback defining a level having an unknown timing relationship. Further, training is typically dependent on ordering, such as to train the command/address lanes 210 before training the DQ lanes 204.

Consequently, initial training is performed by the PHY 122 without knowledge of a correct timing of the command/address lanes 210 and without correct voltage or time references for the transceivers that implement the physical interface 124. However, training by the PHY 122 is still dependent on feedback received from the DRAM devices and interpretation of that feedback.

Advantageously, however, the retraining mode 128 overcomes this challenge by using the initial training data 130 as seed data to interpret the feedback received from the DRAM devices and/or to arrive at an optimal combination of data values for inter-dependent parameters more quickly or more efficiently. For example, the PHY 122 operating in the retraining mode 128 is configured to use the stored values of the command/address lane timing parameters 132, and/or the DFE parameters 136 in the initial training data 130 to more quickly and/or more efficiently compute inter-dependent parameters such as data eye centering parameters 138 and write-leveling parameters 134 than if no seed data were available. Alternatively or additionally, the retraining mode 128 is configured to skip retraining certain parameters (e.g., command parameters 132, DFE parameters 136, etc.) and just retrain more critical or more likely to drift parameters dependent thereon (e.g., write-leveling parameters 134, data eye centering parameters 138, etc.).

Accordingly, the PHY 122 in this example utilizes the initial training data 130 stored in the training mode 128 as seed data (or by simply reusing the old values without any updates) to reduce the overall time and/or resources required to generate the updated training data 140 when executing the retraining mode 128.

Figure 3:
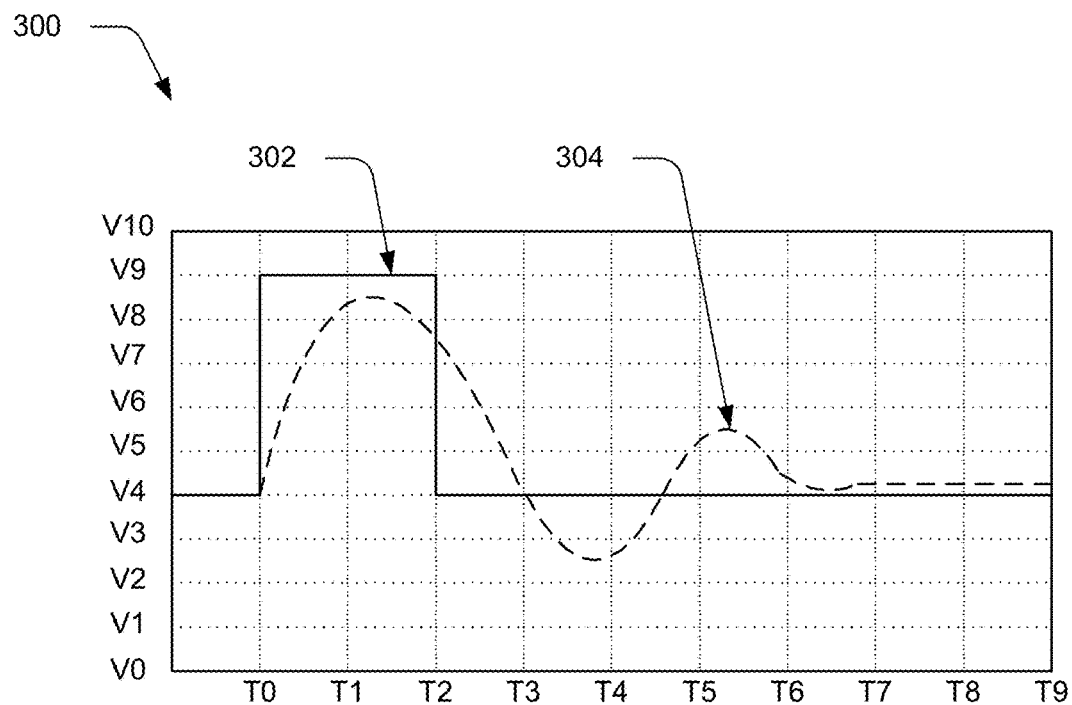
FIG. 3 is a graphical representation of an example single-bit logic high response of a memory read or write operation via a PHY.
Figure 4:
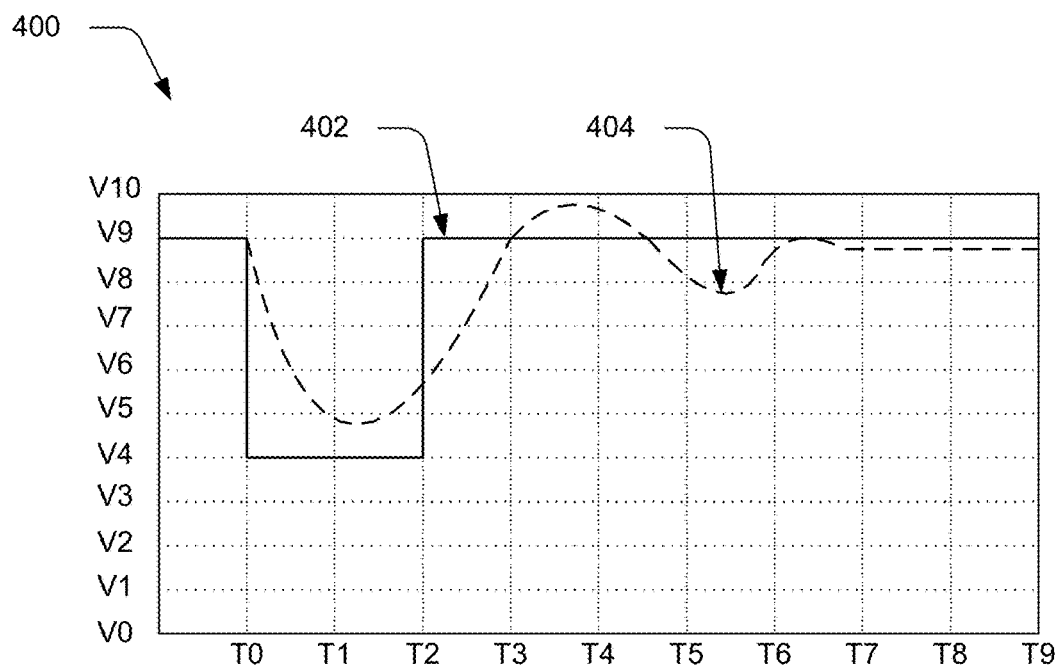
FIG. 4 is a graphical representation of an example single-bit logic low response of a memory read or write operation via a PHY.

FIG. 3 is a graphical representation 300 of an example single-bit logic high (bit '1') response of a memory read or write operation via the PHY 122. FIG. 4 is a graphical representation 400 of an example single-bit logic low (bit '0') response of a memory read or write operation via a PHY 122. For example, the PHY 122 transmits a bit value of '1' to physical memory 110 by driving the signal 302 at a given DQ lane 204 to a voltage V9 between time T1 and T2. Alternatively or additionally, the physical memory 110 sends the bit value of '1' by driving the signal 302 of DQ lane 204 to voltage V9 between time T1 and T2, and so on. Conversely, a bit value of '0' can be communicated by driving signal 402 to a logical low value (voltage V4) as illustrated in FIG. 4.

In practice, however, the actual signals transmitted in the DQ lane 204 are gradually ramped up or down as illustrated by signals 304, 404 rather than instantaneously transitioning between V4 and V9. Thus, for the PHY 122 to successfully detect both logic high and low signals (i.e., signal 302 or 304), the PHY 122 should sample signal 304 and/or 404 at an appropriate delay (e.g., near the peaks of signals 304, 404 between T1 and T2) and by measuring the voltage of the DQ lane 204 relative to an appropriate Vref that is ideally as far as possible from both peaks. The process of training the optimal Vref and strobe delay values for this type of scenario may be referred to herein as data eye centering.

Additionally, as illustrated in FIGS. 3-4, signals 304, 404 slowly decay and have secondary peaks (e.g., between T3 and T4, and between T5 and T6). If additional symbols are communicated between the PHY 122 and the physical memory 110 during these time periods, inter-symbol interference may occur (e.g., constructive or destructive interference), which may result in a false measurement. For example, in the scenario of FIG. 3, if a logic high (V9) signal is transmitted between T2-T4, destructive interference may reduce the peak of the voltage sampled between T3-T4. To mitigate inter-symbol interference, the PHY 122 and/or the physical memory 110 may include equalization circuitry configured to correct or reduce the interference artifacts, which can improve signal quality especially in scenarios where multiple high frequency DQ signals interfere with one another. This process may be referred to as DFE coefficient training.

Figure 5:
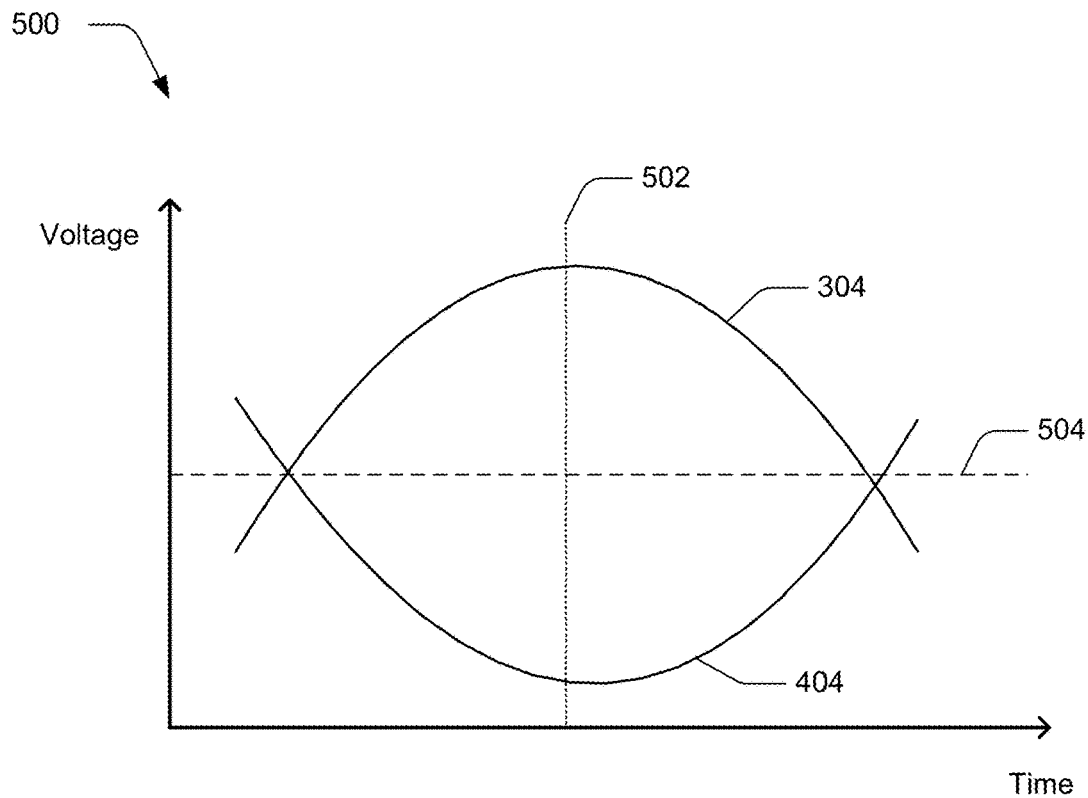
FIG. 5 is a graphical representation of an example data eye of a memory cycle used for memory training in accordance with the training and retraining mode techniques described herein.

FIG. 5 is a graphical representation of an example data eye 500 of a memory cycle used for memory training in accordance with the training and retraining mode techniques described herein. For example, the data eye 500 represents a data bus signal that includes portions of the signals 304 and 404 that include the main peaks of the signals (e.g., between T0 and T2). The data eye 500 is a visual representation of the signals sampled to train the strobe delay parameter 502 and Vref parameter 504 (e.g., collectively corresponding to the data eye centering parameters 138).

Although the data eye 500 is shown to include a single logic-high response (signal 304) and a single logic low response (signal 404) for the sake of clarity, in examples, the data eye 500 includes more or fewer signals superimposed to generate the data eye 500. Furthermore, although FIG. 5 shows a single data eye 500 for the sake of clarity, it is understood that the system 100 can generate multiple data eyes (e.g., for training each of the DQ lanes 204, etc.) and each data eye may include fewer or more training symbols to be sampled for training the Vref parameter 504 and the strobe delay parameter 502.

In an example, to increase the likelihood of successfully detecting logic high signals (e.g., signal 304) and logic low signals (e.g., signal 404), in the training mode 12, the PHY 122 is configured to sweep across a range of possible Vref values (e.g., V0-V10 and a range of possible time delay values (e.g., between T0-T2) to find an optimal combination that is ideally as far as possible from the vertical and horizontal edges of the data eye 500 that intersect with Vref parameter 504 and strobe delay parameter 502. Thus, this process may involve a 2D search to consider all possible combinations of Vref and time.

Furthermore, as noted earlier, the shape of the data eye 500 and its vertical and horizontal extents may depend on the DFE coefficients (DFE parameters 136) used to cancel inter-symbol interference. Thus, a comprehensive search may also involve sweeping through all the possible voltage and time values for every possible combination of possible values of each DFE coefficients. For example, if three DFE coefficients are used, then a 5D search is needed to search all the Vref and strobe delay combination in every possible data eye 500 formed using every possible combination of DFE coefficients.

In the retraining mode 128 however, in examples, the PHY 122 is advantageously configured to skip retraining the DFE parameters 136 by using the previously trained values of the DFE coefficients from the initial training data 130 to perform the data eye centering process (i.e., Vref and strobe delay centering) on a single data eye 500, i.e., a 2D search instead of a 5D search. As a result, significant savings can be achieved in terms of computing power and time requirements to retrain the Vref and strobe delay parameter values without necessarily retraining the interdependent DFE coefficient parameter values. Furthermore, the overall performance and reliability of the PHY 122 is improved by frequently retraining the Vref and strobe delay values of the data eye 500, even if the DFE coefficient parameters 136 are less frequently retrained.

Figure 6:
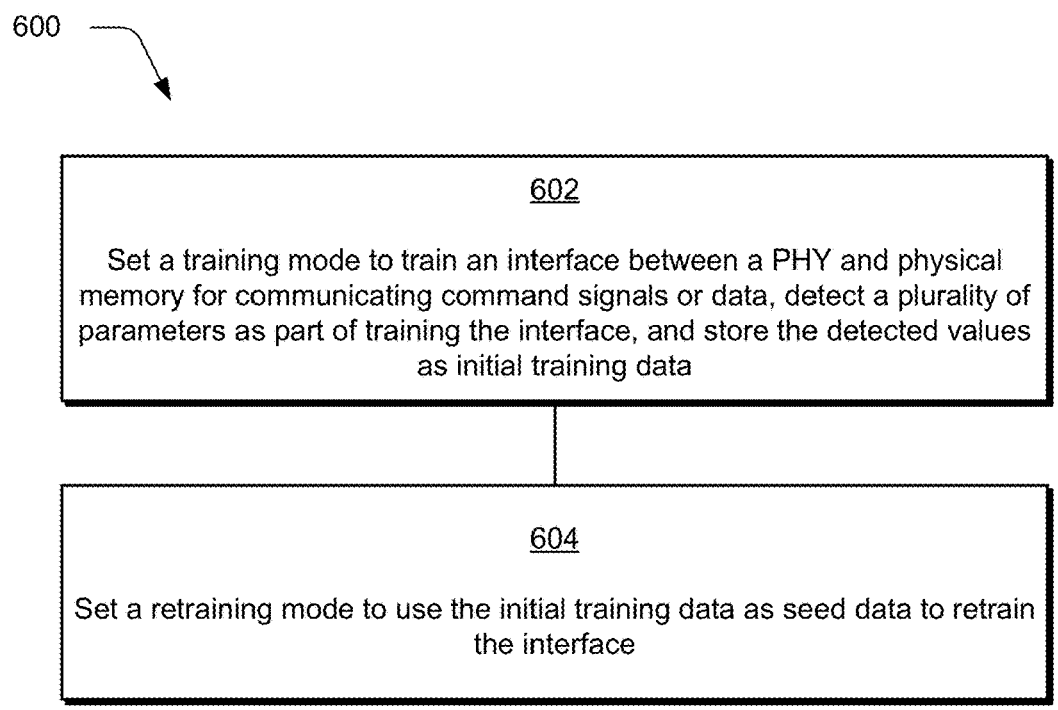
FIG. 6 depicts a procedure in an example implementation of training and retraining mode for an interface communicatively coupling a PHY with physical memory.

FIG. 6 depicts a procedure 600 in an example implementation of training and retraining mode for an interface communicatively coupling a PHY with physical memory.

A training mode is set to train an interface between an PHY and physical memory to communicate command signals or data. The training mode detects a plurality of parameters as part of training the interface, and stores the detected values as initial training data (block 602). By way of example, the PHY 122 generates and stores the initial training data 130 by detecting values of the plurality of parameters 132, 134, 136, and 138.

A retraining mode is set to retrain the interface using the initial data as seed data (block 604). By way of example, the retraining mode 128 uses the command parameters 132 and the DFE parameters 136 as seed data to reduce the iterative process and/or the search spaces associated with retraining the write-leveling parameters 134 and/or the data eye centering parameters 138. A variety of other examples are also contemplated.

It should be understood that many variations are possible based on the disclosure herein. Although features and elements are described above in particular combinations, each feature or element is usable alone without the other features and elements or in various combinations with or without other features and elements.

The various functional units illustrated in the figures and/or described herein (including, where appropriate, the device 102) are implemented in any of a variety of different manners such as hardware circuitry, software or firmware executing on a programmable processor, or any combination of two or more of hardware, software, and firmware. The methods provided are implemented in any of a variety of devices, such as a general purpose computer, a processor, or a processor core. Suitable processors include, by way of example, a general purpose processor, a special purpose processor, a conventional processor, a digital signal processor (DSP), a graphics processing unit (GPU), a parallel accelerated processor, a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

In one or more implementations, the methods and procedures provided herein are implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Although the systems and techniques have been described in language specific to structural features and/or methodological acts, it is to be understood that the systems and techniques defined in the appended claims are not necessarily limited to the specific features or acts described. Rather, the specific features and acts are disclosed as example forms of implementing the claimed subject matter.

What is claimed is:

1. A device comprising:
a physical memory; and
a physical layer (PHY) having an interface to support communication of command signals and data with the physical memory, the PHY implementing:
a training mode to train the interface, detect values of a plurality of parameters as part of training the interface, and store the detected values as initial training data; and
a retraining mode to use the initial training data as seed data to retrain the interface during a reboot or startup of the device.

2. The device of claim 1, wherein the interface implements an interface protocol that employs the plurality of parameters to control communication of the command signals and the data with the physical memory.

3. The device of claim 2, wherein the plurality of parameters includes at least one parameter associated with voltage reference (Vref) training, command training, clock-to-strobe leveling, write-leveling training, or strobe-to-DQ training of the interface protocol.

4. The device of claim 1, wherein the plurality of parameters includes a parameter for controlling intersymbol interference between physical memory components of the physical memory.

5. The device of claim 1, wherein the retraining mode detects updated values of a first subset of the plurality of parameters and reuses previously stored values of a second subset of the plurality of parameters as part of retraining the interface.

6. The device of claim 5, wherein the first subset includes parameters associated with voltage reference (Vref) and strobe delay training for data eye centering, and wherein the second subset includes parameters associated with decision feedback equalization (DFE) coefficient training.

7. The device of claim 5, wherein the first subset includes a first parameter associated with write-leveling training, and wherein the second subset includes a second parameter associated with command address timing training.

8. The device of claim 1, wherein the PHY includes another interface to transfer command signals and data with a memory controller.

9. The device of claim 1, wherein the PHY is implemented in hardware as part of an integrated circuit, the interface is bidirectional, and the physical memory is a dynamic random access memory (DRAM).

10. A system comprising:
a memory controller;
a dynamic random access memory (DRAM); and
a physical layer (PHY) communicatively coupled with the memory controller and the DRAM, the PHY implementing:
a training mode to detect values of a plurality of parameters as part of training an interface between the PHY and the DRAM, and to store the detected values as initial training data; and
a retraining mode to use the initial training data as seed data to retrain the interface between the PHY and the DRAM during a reboot or startup.

11. The system of claim 10, wherein the interface implements an interface protocol that employs the plurality of parameters to control communication of command signals and data with the DRAM.

12. The system of claim 11, wherein the plurality of parameters includes at least one parameter associated with voltage reference (Vref) training, command training, clock-to-strobe leveling, write-leveling training, or strobe-to-DQ training of the interface protocol.

13. The system of claim 10, wherein the plurality of parameters includes a parameter for controlling intersymbol interference between physical memory components of the physical memory.

14. The system of claim 10, wherein the retraining mode detects updated values of a first subset of the plurality of parameters and reuses previously stored values of a second subset of the plurality of parameters as part of retraining the interface.

15. The system of claim 14, wherein the first subset includes parameters associated with voltage reference (Vref) and strobe delay training for data eye centering, and wherein the second subset includes parameters associated with decision feedback equalization (DFE) coefficient training.

16. The system of claim 14, wherein the first subset includes a first parameter for write-leveling training, and wherein the second subset includes a second parameter for command address timing training.

17. A method comprising:
setting a training mode to train an interface between a physical layer (PHY) and physical memory for communicating command signals or data, detect values of a plurality of parameters as part of training the interface, and store the detected values as initial training data; and
setting a retraining mode to use the initial training data as seed data to retrain the interface during a reboot or startup.

18. The method of claim 17, wherein retraining the interface includes detecting updated values of a first subset of the plurality of parameters and reusing previously stored values of a second subset of the plurality of parameters.

19. The method of claim 18, wherein the first subset includes parameters associated with voltage reference (Vref) and strobe delay training for data eye centering, and wherein the second subset includes parameters associated with decision feedback equalization (DFE) coefficient training.

20. The method of claim 18, wherein the first subset includes a first parameter for write-leveling training, and wherein the second subset includes a second parameter for command address timing training.

* * * * *